(12) United States Patent
Chen

(10) Patent No.: US 10,788,519 B1
(45) Date of Patent: Sep. 29, 2020

(54) CURRENT DETECTING MODULE AND CURRENT TESTER

(71) Applicant: PROVA INSTRUMENTS INC., New Taipei (TW)

(72) Inventor: Lee-Fei Chen, New Taipei (TW)

(73) Assignee: PROVA INSTRUMENTS INC., New Taipei (TW)

( * ) Notice: Subject to any disclaimer, the term of this patent is extended or adjusted under 35 U.S.C. 154(b) by 0 days.

(21) Appl. No.: 16/389,045

(22) Filed: Apr. 19, 2019

(51) Int. Cl.
*G01R 19/25* (2006.01)

(52) U.S. Cl.
CPC ..................... *G01R 19/25* (2013.01)

(58) Field of Classification Search
CPC ... G01V 3/18; G01V 1/52; G01V 3/34; G01V 3/38; G01V 5/04; E21B 47/00; E21B 4/02; E21B 7/062
USPC ................ 324/366, 346, 333, 334, 338, 339
See application file for complete search history.

(56) References Cited

U.S. PATENT DOCUMENTS

| | | | | |
|---|---|---|---|---|
| 3,854,374 A * | 12/1974 | Boyle | ................. | F16B 19/1081 411/80.1 |
| 6,580,268 B2 * | 6/2003 | Wolodko | .............. | E21B 47/009 324/240 |
| 6,765,385 B2 * | 7/2004 | Sinclair | .................... | G01V 3/30 324/338 |
| 6,774,639 B1 * | 8/2004 | Unsworth | .......... | G01R 31/1227 324/547 |
| 2006/0032743 A1 * | 2/2006 | Harima | .............. | G01N 27/4168 204/401 |
| 2014/0306711 A1 * | 10/2014 | Hu | ........................... | G01V 3/20 324/367 |

* cited by examiner

*Primary Examiner* — Giovanni Astacio-Oquendo
(74) *Attorney, Agent, or Firm* — Birch, Stewart, Kolasch & Birch, LLP

(57) ABSTRACT

A current detecting module includes a circular shell with a ferrite core, a first sensor element, and a second sensor element disposed within. The first sensor element and the second sensor element sense the magnetic field confined in the magnetic circuit formed by the ferrite core, and generate a first sensing signal and a second sensing signal respectively. A current tester includes a device body, and the current detecting module is assembled with the device body. The device body includes a switching element, a monitor module and a signal processing module. The signal processing module receives the first sensing signal or the second sensing signal, and controls the monitor module to display a measured value accordingly. With two different sensing signals, the current detecting module or the current tester can be used to measure different ranges of currents and achieve high accuracy at the same time.

17 Claims, 10 Drawing Sheets

CURRENT DETECTING MODULE AND CURRENT TESTER

BACKGROUND OF THE INVENTION

1. Field of the Invention

The present invention relates to a current detecting module and a current tester, and more particularly to a current detecting module and a current tester with multiple detection ranges.

2. Description of the Related Art

Current detecting modules or current measuring devices are widely used in various fields. A current detecting module includes a magnetic field sensor, which senses the magnetic field generated by a current and outputs a sensing signal that corresponds to the value of the current. The sensing signal is then further processed to calculate the value of the current. However, a current detecting module or a current measuring device can only detect and measure currents within a certain range, and is only able to provide a limited degree of accuracy. If a current exceeds the specification of the current detecting module or the current measuring device, the device is unusable and the user would have to look for another device. For example, a current tester designed for industrial power distribution may be specified to measure currents between 600 amperes and 2000 amperes with an accuracy of 0.1 A. If a user needs to measure a current between 30 A and 40 A and the required accuracy is 0.01 A, the current tester cannot provide an appropriate measuring function, and the user has to use another current tester.

SUMMARY OF THE INVENTION

An objective of the present invention is to provide a current detecting module and a current tester applying the current detecting module.

To achieve the foregoing objective, the current detecting module includes a circular shell, a ferrite core, a first sensor element, and a second sensor element, wherein the ferrite core, the first sensor element, and the second sensor element are mounted inside the circular shell. The first sensor element and the second sensor element sense the magnetic field running through the ferrite core and produce a first sensing signal and a second sensing signal.

The circular shell surrounds a sensing area, which allows a current to run through. The current may create a magnetic field that runs through the magnetic circuit set by the ferrite core. The first sensor element and the second sensor element sense the magnetic field and generate sensing signals independently. The properties of the first sensor element and the second sensor element are different, that is, each sensor element responds to a different range of magnetic field, and each sensing signal can properly correspond to a different range of currents running through the sensing area. As a result, when a user knows the general value of the current to be tested, the user can choose the first sensing signal or the second sensing signal generated to be the output. By choosing the proper sensing signal for further transmission and processing, the user does not have to look for another current sensing module or tester, thus overcoming the inconvenience of the conventional current tester or current detecting module.

The present invention also provides a current tester, including the current tester and a device body. The device body has an accommodation space, a testing end, and an operating interface. The current detecting module is mounted on the testing end of the device body. The current detecting module further includes a signal transmitting and processing unit, and the signal transmitting and processing unit is mounted inside the circular shell and has an input end and an output end, wherein the input end is electrically connected to the first sensor element and the second sensor element, and the output end extends to the accommodation space of the device body. The device body further includes a switching element and a monitor module. The switching element has two input ends and an output end, and the two input ends are connected to the output end of the signal transmitting and processing unit to receive the first sensing signal and the second sensing signal. The switching element then conducts one of its input ends to the output end and outputs an original sensing signal from the output end.

The signal processing module is electrically connected to the output end of the switching element and the monitor module. The signal processing module receives the original sensing signal from the switching element and controls the monitor module to display a current value according to the original sensing signal and a switching state of the switching element.

By operating the switching element, a user can switch the original sensing signal received by the processing module between the first sensing signal and the second sensing signal. The signal processing module then calculates the current value corresponding to the sensing signal it receives, and controls the monitor module to display accordingly. That is, by operating the switching element, the current tester can be used to measure currents in different ranges, and display current values in different scales and degrees of accuracy.

For example, according to the property of each sensor element and amongst a certain current detecting module, the first sensor element is able to measure a current between 0 A and 40 A appropriately, and the second sensor element can measure a current between 0 A and 600 A. In this case, a user can measure a current around 10 A and a current around 100 A without having to replace the device, offering a much more convenient user experience.

Other objectives, advantages and novel features of the invention will become more apparent from the following detailed description when taken in conjunction with the accompanying drawings.

DETAILED DESCRIPTION OF THE INVENTION

Figure 1:
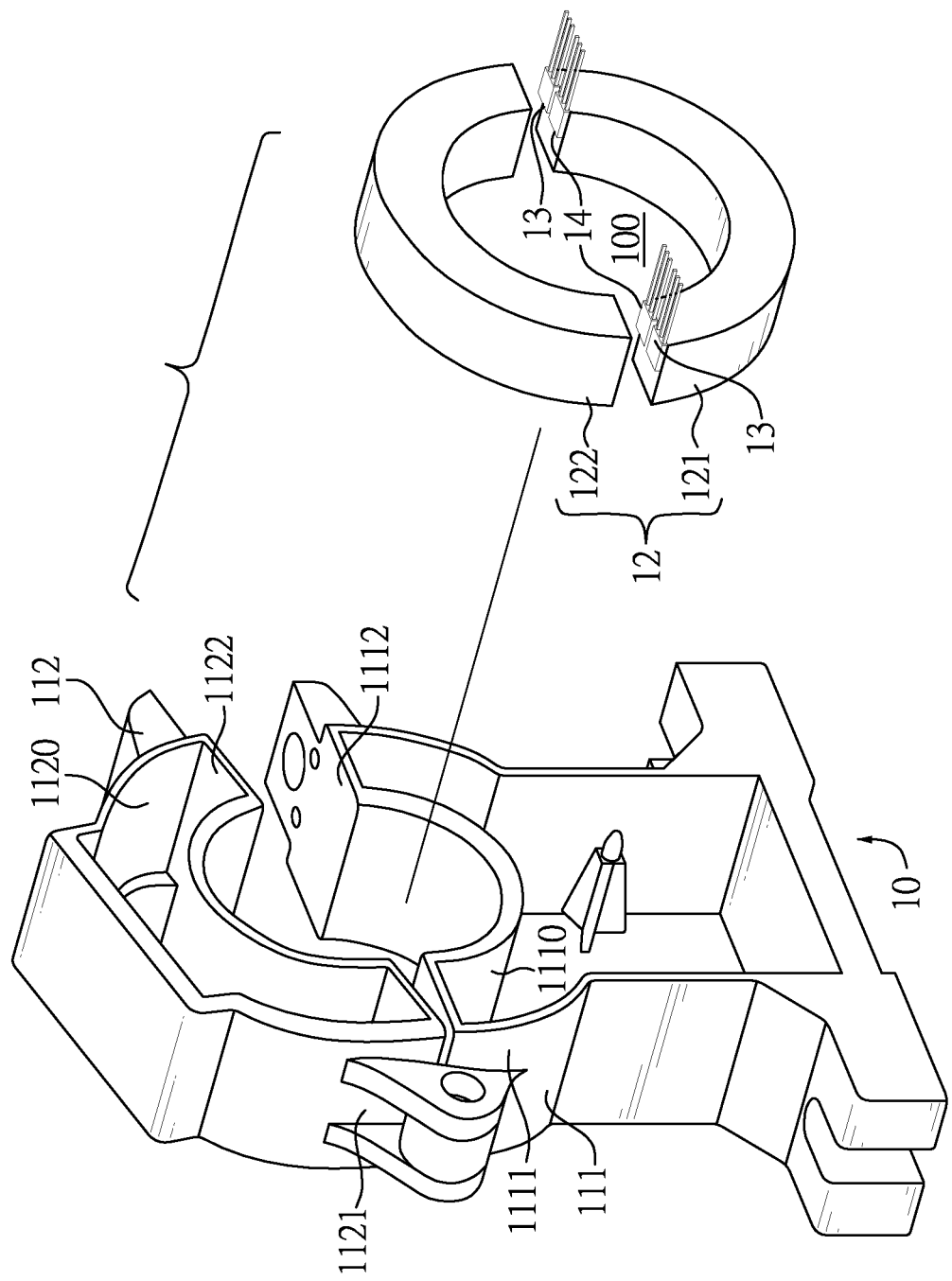
FIG. 1 is an exploded view of a first embodiment of a current detecting module of the present invention.

With reference to FIG. 1, the present invention provides a current detection module 10, including a circular shell 11, a ferrite core 12, a first sensor element 13, and a second sensor element 14. The ferrite core 12, the first sensor element 13 and the second sensor element 14 are mounted inside the circular shell 11. The first sensor element 13 and the second sensor element 14 sense the magnetic field running through the ferrite core 12, and the first sensor element 13 generates a first sensing signal, and the second sensor element 14 generates a second sensing signal accordingly.

The circular shell 11 forms a sensing area 100 in the middle, which allows a current carrying wire or cable to run through, so that the first and second sensor elements 13, 14 sense the magnetic field running through the ferrite core 12 and generate the sensing signals that are in proportion to the absolute value of a tested current.

In a first embodiment of the present invention, the first sensor element 13 and the second sensor element 14 are Hall Effect sensors with different specifications, and the first sensor element 13 and the second sensor element 14 are designed to sense different ranges of magnetic fields. For example, the first sensor element 13 is able to sense a magnetic field between 0 Gauss (G) and 100 G and outputs a first sensing signal between 0 volt (V) and 40 mV in proportion with the value of the magnetic field. The second sensor element 14 is able to sense a magnetic field between 0 G and 1000 G and outputs a second sensing signal between 0V and 40 mV in proportion with the value of the magnetic field.

Furthermore, according to the proportion between the sensing signals and the magnetic field sensed and the condition of the ferrite core 12, the first sensing signal generated by the first sensor element 13 may be used to measure a tested current between 0 and 40 A that runs through the sensing area 100, with an accuracy of 0.01 A, and the second sensing signal generated by the second sensor element 14 may be used to measure a tested current between 0 and 400 A, with an accuracy of 0.1 A. Therefore, when a tested current is known to be around 100 A, it is appropriate to choose the second sensing signal as an output signal for the tested current. When a tested current is known to be around 10 A, or a higher accuracy is required, the first sensing signal is outputted for the tested current. Therefore, a user can choose the first sensing signal or the second sensing signal as an output signal according to the testing environment or requirement. That is, the current detecting module 10 in the present invention is able to measure different ranges of currents with different degrees of accuracy, and thus can be applied to different testing environments or conditions.

Figure 2:
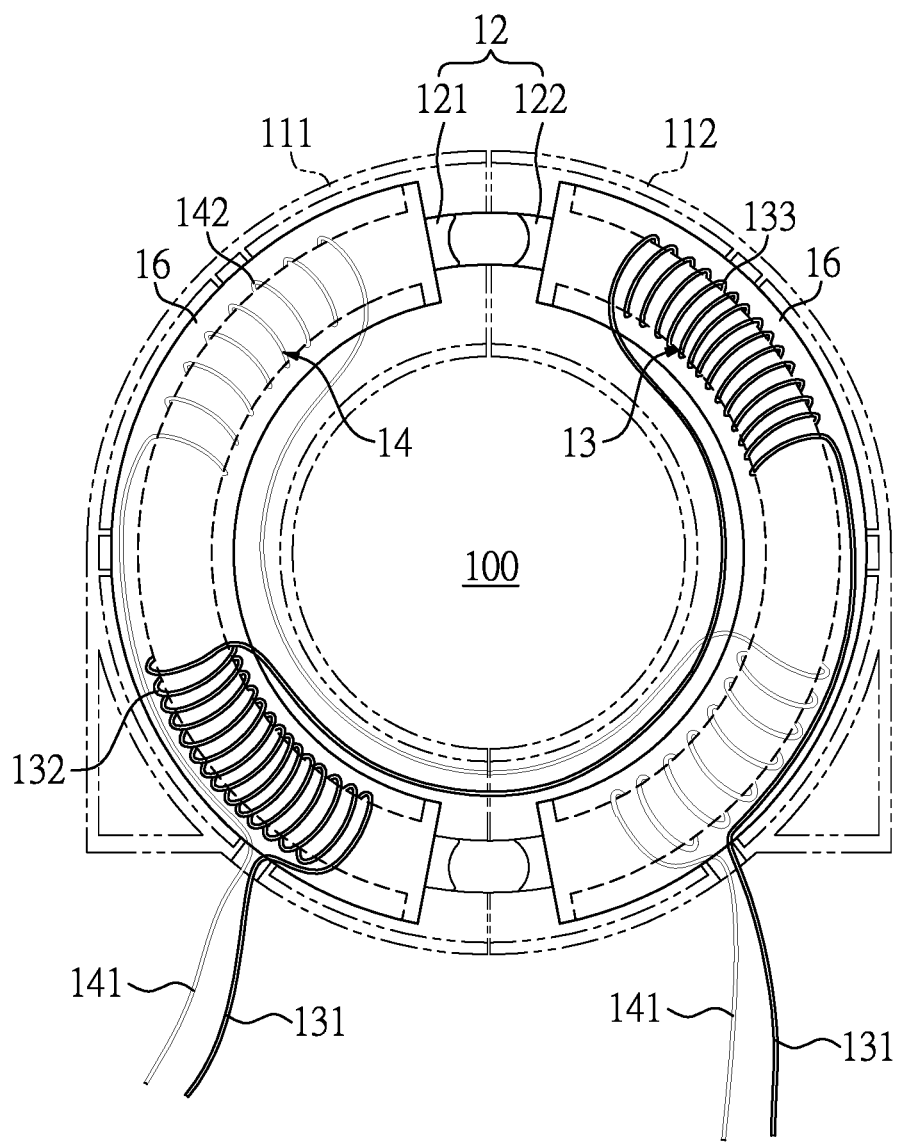
FIG. 2 is a plan view of a second embodiment of a current detecting module of the present invention.

With reference to FIG. 2, in a second embodiment of the present invention, the first sensor element 13 is a first winding 13 having two first tail ends 131, and the second sensor element 14 is a second winding 14 with two second tail ends 141. The first winding 13 and the second winding 14 are both wound around the ferrite core 12, and the first winding 13 and the second winding 14 have different numbers of turns.

The current detecting module 10 with the sensor elements being the first winding 13 and the second winding 14 may be used to detect an alternative current (AC). The first winding 13 and the second winding 14 may generate AC first sensing signal and second sensing signal, which are induced by the tested current. Since the numbers of turns are different, the values of the first sensing signal and second sensing signal are in different proportions with the same tested current, and provide different degrees of accuracy. To be more specific, a first winding 13 with a fewer number of turns may generate a sensing signal with a larger current and a lower accuracy corresponding to the tested current; a second winding with a larger number of turns may generate a sensing signal with smaller current but a higher accuracy corresponding to the tested current.

Figure 3:
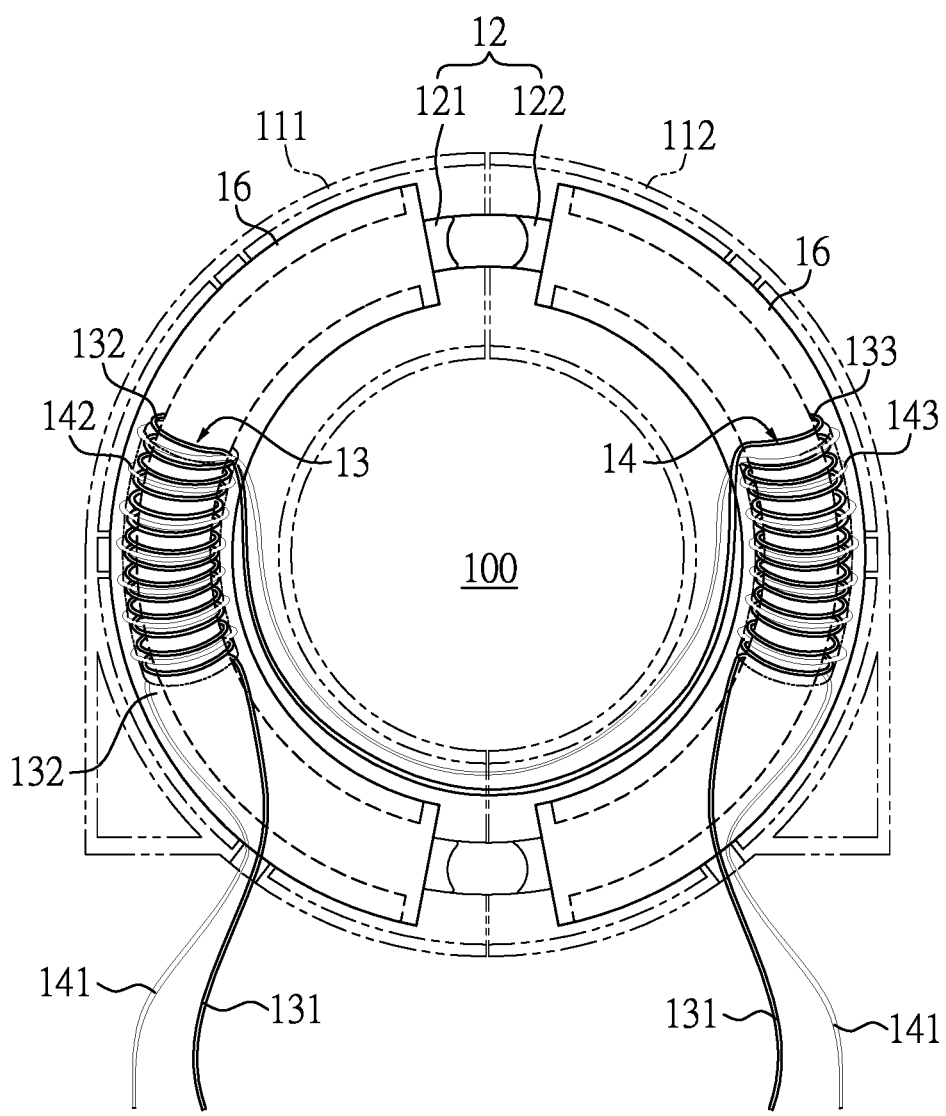
FIG. 3 is a sectional view of a third embodiment of a current detecting module of the present invention.

With reference to FIG. 3, in a third embodiment, the first winding 13 is wound around the ferrite core 12, and the second winding 14 is wound outside and around the first winding 13. Furthermore, an insulation layer 15 is disposed between the first winding 13 and the second winding 14 to ensure the insulation.

With reference to FIG. 3, in the present embodiment, the current detecting module 10 further includes a metal circular shell 16. The metal circular shell 16 is mounted inside the circular shell 11 and covers the ferrite core 12 as well as the first winding 13 and the second winding 14. The metal circular shell 16 insulates the first winding 13 and the second winding 14 from external noise signals.

With reference to FIG. 1, the circular shell 11 of the current detecting module 10 includes a first half shell 111 with a first accommodation space 1110, and a second half shell 112 with a second accommodation space 1120. The first half shell 111 has a first pivot end 1111 and a first connecting end 1112, and the second half shell 112 has a second pivot end 1121 and a second connecting end 1122. The second pivot end 1121 is pivotally connected to the first pivot end 1111. The ferrite core 12 includes a first semicircular core 121 mounted in the first accommodation space 1110, and a second semicircular core 122 mounted in the second accommodation space 1120. When the first half shell 111 and the second half shell 112 are closed, the first connecting end 1112 of the first half shell 111 contacts the second connecting end 1122, so that the first semicircular core 121 in the first half shell and the second semicircular core 122 122 in the second half shell form a magnetic circuit. The magnetic circuit confines the magnetic flux generated by the tested current running through the sensing area 100 in the middle.

In the embodiments that the sensor elements being the Hall effect sensors, the first sensor element 13 and the second sensor element 14 are disposed within the first accommodation space 1110, more specifically at one of the two opposite ends of the first semicircular core 121. For example, the sensor elements 13, 14 are disposed close to the first pivot end 1111 or the first connecting end 1112, so that the first sensor element 13 and the second sensor element 14 are between an end of the first semicircular core 121 and an end of the second semicircular core 122. In short, the first sensor element 13 and the second sensor element 14 are disposed in the magnetic circuit that the ferrite core 12 forms to sense the magnetic flux within the magnetic circuit.

In addition, the current detecting module 10 may include two first sensor elements 14 and two second sensor elements 14 as shown in FIG. 1, composing two sets of one first sensor element 13 and one second sensor element 14. One set of first sensor element 13 and second sensor element 14 is disposed close to the first pivot end 1111 in the first accommodation space, and the other set of first sensor element 13 and second sensor element 14 is disposed close to the first connecting end 1112 in the first accommodation space 1110. The two first sensor elements 13 output a first sensing signal commonly, and the two second sensor elements 14 output a second sensing signal commonly. A more precise first sensing signal and second sensing signal is acquired by disposing two first sensor elements and two second sensor elements.

With reference to FIG. 2 and FIG. 3, in the embodiments that the sensor elements being the first winding 13 and the second winding 14, the first winding 13 has a first part 132 and a second part 133, and the first part 132 of the first winding 13 is wound around the first semicircular core 121, and the second part 133 of the first winding 13 is wound around the second semicircular core 122. The second winding 14 also has a first part 142 and a second part 143, and the first part 142 of the second winding 14 is wound around the first semicircular core 121, and the second part 143 of the second winding 14 is wound around the second semicircular core 122. The first part 132 and the second part 133 of the first winding 13 is electrically connected with the same polarity, as well as the first part 142 and the second part 143 of the second winding 14. By disposing two parts of the windings on each semicircular core, the sensing signals are independent from the exact location of the tested current in the sensing area 100, thus providing better stability.

With reference to FIG. 2, the first part 132 of the first winding 13 and the first part 142 of the second winding 14 may be wound separately on the first semicircular core 121, and the second part 133 of the first winding 13 and the second part 143 of the second winding 14 may be wound separately on the second semicircular core 122.

With reference to FIG. 3, in another embodiment, the first part 132 of the first winding 13 and the first part 142 of the second winding 14 may be wound around the same position on the first semicircular core 121, with the first part 132 of the first winding 13 wound directly on the first semicircular core 121, and the first part 142 of the second winding 14 wound around the outside of the first part 132 of the first winding 13. Similarly, the second part 133 of the first winding 13 and the second part 143 of the second winding 14 may be wound around the same position on the second semicircular core 122, with the second part 133 of the first winding 13 wound directly on the second semicircular core 122, and the second part 143 of the second winding 14 wound around the outside of the first part 132 of the first winding 13.

Figure 4:
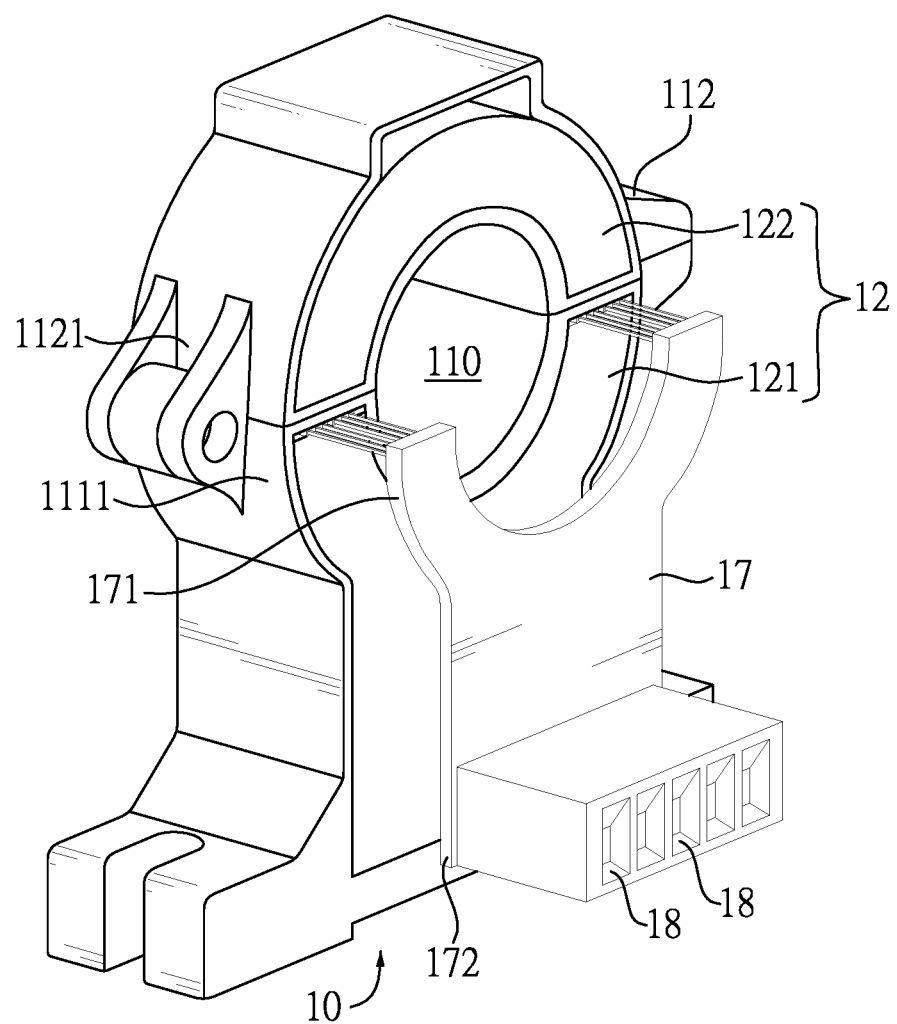
FIG. 4 is a perspective view of a fourth embodiment of a current detecting module of the present invention.

With reference to FIG. 4, in the fourth embodiment that the first sensor element and the second sensor signal are the Hall effect sensors, the current detecting module 10 further includes a signal transmitting and processing unit 17 and two signal output ports 18. The signal transmitting and processing unit 17 has an input end 171 and an output end 172, and the first sensor element and the second sensor element are electrically connected to the input end 171 of the signal transmitting and processing unit 17, and the signal output ports 18 are electrically connected to the output end 172 of the signal transmitting and processing unit 17. The signal output ports 18 are connected to the first sensor element and the second sensor element through the signal transmitting and processing unit 17. The signal transmitting and processing unit 17 receives the first sensing signal and the second sensing signal, amplifies and stabilizes the first sensing signal and the second sensing signal before outputting the first sensing signal and the second sensing signal to the signal output ports 18. The first sensing signal and the second sensing signal outputted from the signal output port 18 can be then used to measure the current.

According to the design of the current detecting module 10, or the requirement of the back-end processing system, the signal transmitting and processing unit 17 may be a printed circuit board (PCB), a flexible printed circuit (FCP), or signal transmission lines. The signal output ports 18 may be flat cable female/male or any kind of board connector. The current detecting module 10 of the present invention may be applied to the tested current and output the first sensing signal and the second sensing signal from the signal output ports 18 for further measuring. Since the first sensing signal and the second sensing signal are generated according to the same tested current but in different proportions to the current value, the user can choose between the first sensing signal and the second sensing signal from the signal output ports 18 according to the testing environment or predicted value of the tested current, and thus acquiring different testing ranges and degrees of accuracy.

Figure 5:
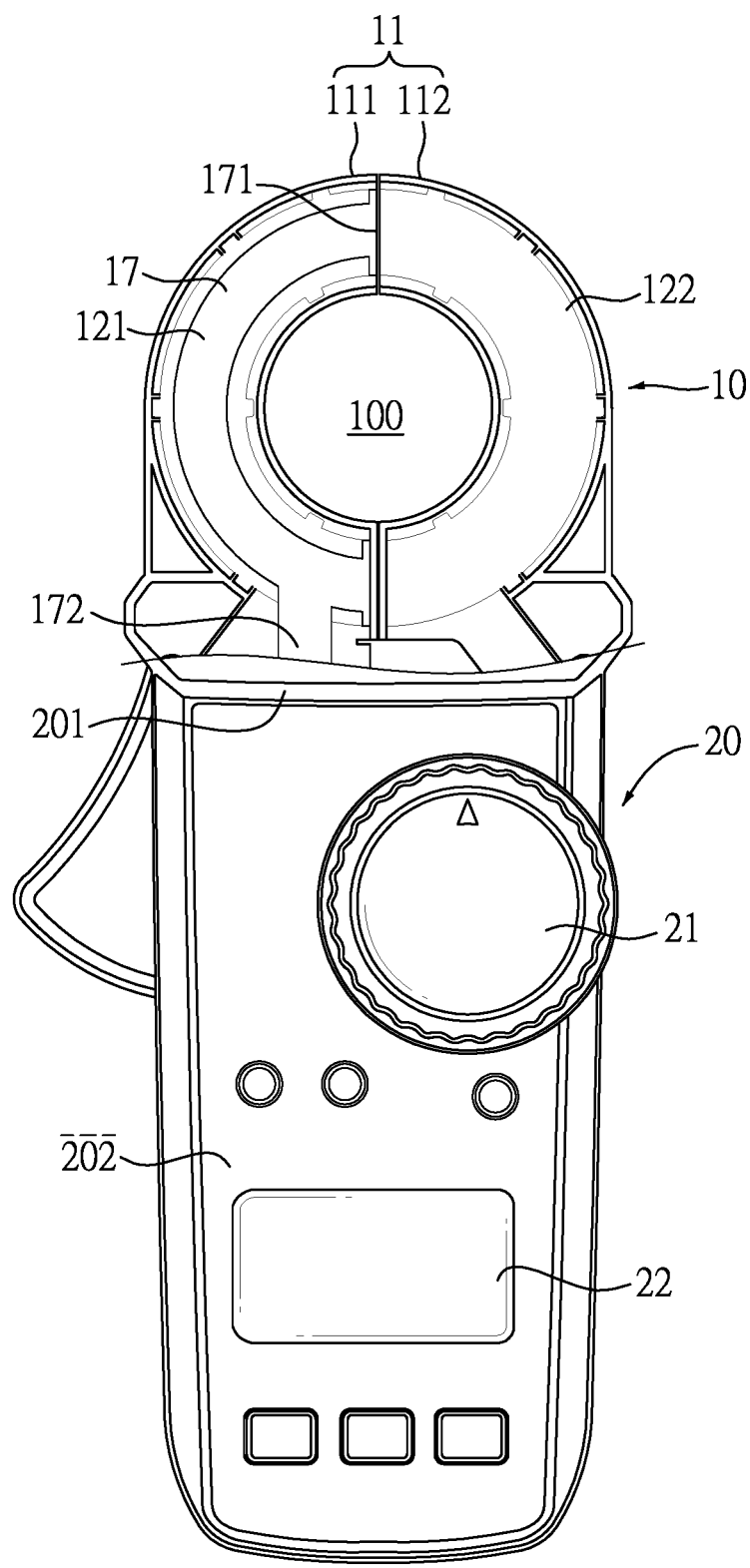
FIG. 5 is a partial sectional view of parts of a fifth embodiment of a current tester of the present invention.
Figure 6:
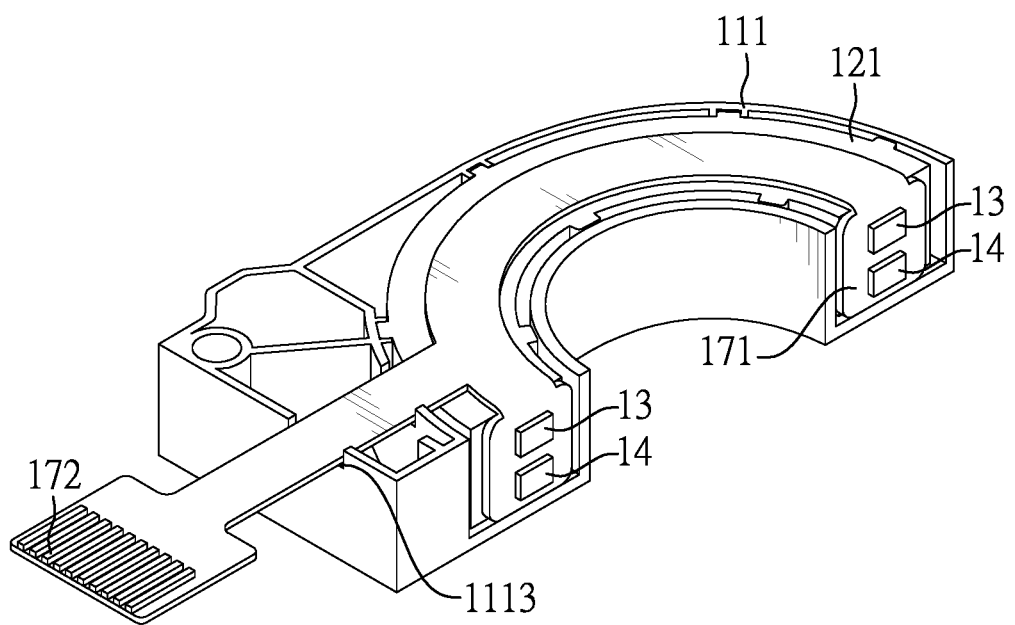
FIG. 6 is a perspective view of parts of a current tester of the present invention.
Figure 7:
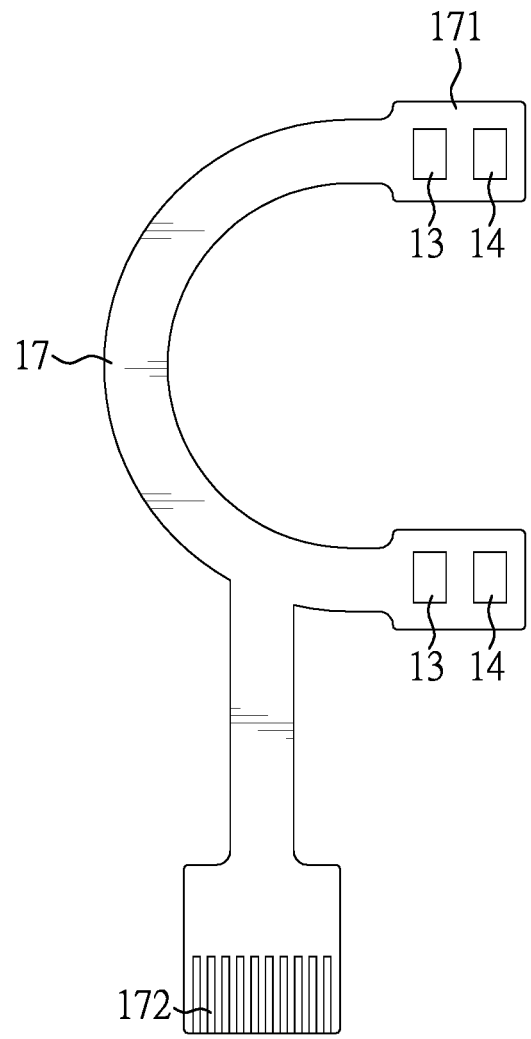
FIG. 7 is another perspective view of parts of a current tester of the present invention.

With reference to FIG. 5 and FIG. 6, in a fifth embodiment of the present invention, the present invention provides a current tester, including the current detecting module 10 and a device body 20. The device body 20 further has an accommodation space, a testing end 201 and an operating interface 202. The device body 20 further includes a switching element 21 and a monitor module 22, which are disposed on the operating interface 202. The current detecting module 10 is mounted on the testing end 201 of the device body 20 and assembled with the device body 20. The circular shell 11 of the current detecting module 10 is designed according to the overall appearance of the current tester and the assembly structure with the device body 20. The signal transmitting and processing unit 17 is mounted in the circular shell 11 and has an input end 171 and an output end 172. Together with reference to FIG. 7, the first sensor element 13 and the second sensor element 14 are electrically connected to the input end 171 of the signal transmitting and processing unit 17, and the output end 172 of the signal transmitting and processing unit 17 extends through the circular shell 11 and into the accommodation space of the device body 20.

On the other hand, in the embodiments that the first sensor element 13 and the second sensor element 14 are the windings, the two first tail ends 131 of the first sensor element 13 and the two second tail ends 141 of the second sensor element 14 extend through the circular shell 11 and into the accommodation space of the device body 20 for further transmission.

Figure 8:
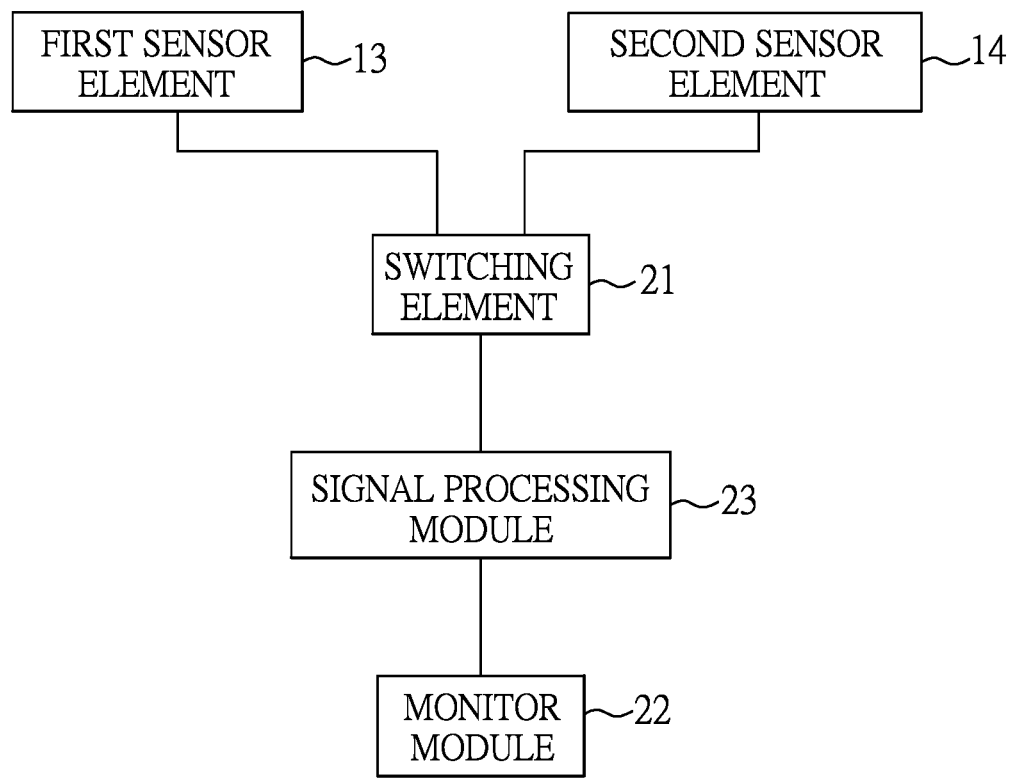
FIG. 8 is a block diagram of a current tester of the present invention.

With reference to FIG. 5 and FIG. 8, the device body 20 further includes a signal processing module 23, which is mounted in the accommodation space of the device body 20. The switching element 21 has two input ends and an output end. The two input ends of the switching element 21 are electrically connected to the output end 172 of the signal transmitting and processing unit 17 to receive the first sensing signal and the second sensing signal. The switching element 21 connects one of its input ends to its output end according to a switching status, and outputs an original sensing signal from the output end. That is, the original sensing signal is either the first sensing signal or the second sensing signal. The signal processing module 23 is electrically connected to the output end of the switching element 21 and the monitor module 22. The signal processing module 23 receives the original sensing signal from the switching element, and detects the switching status of the switching element to decide whether the original sensing signal is the first or the second sensing signal. The signal processing module 23 then processes the original sensing signal accordingly and controls the monitor module 22 to display a measured value of the tested current.

For instance, when the switching element 21 is in a first status, the switching element 21 conducts the first sensor element 13 and the signal processing module 23 and provides the first sensing signal to the signal processing module 23; when the switching element 21 is in a second status, the switching element 21 conducts the second sensor element 14 and the signal processing module 23 and provides the second sensing signal to the signal processing module 23.

Figure 9:
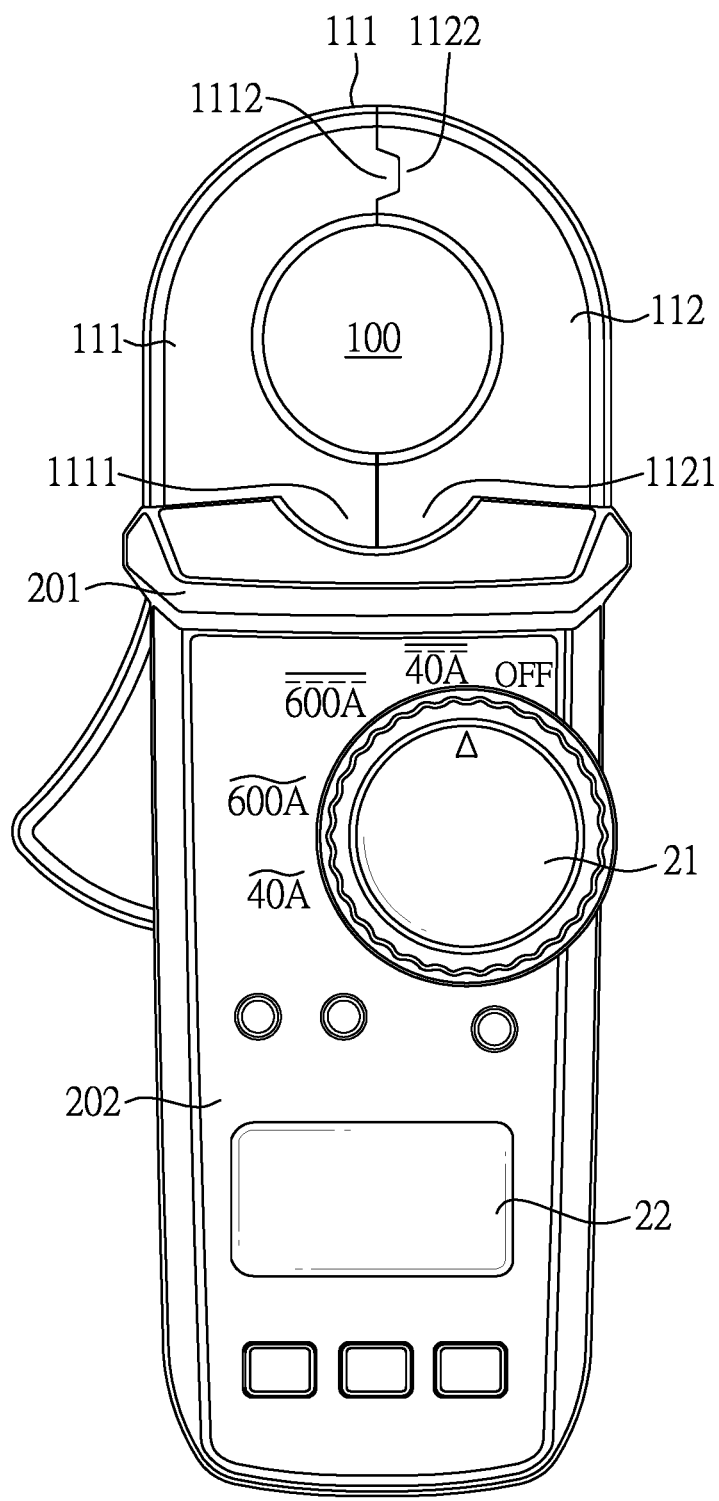
FIG. 9 is a sectional view of a current tester of the present invention.

With reference to FIG. 9, the switching element 21 is operable to a user to switch between the first status and the second status, thereof controlling the original sensing signal received by the signal processing module 23. The switching element 21 may be a mechanical switch or an electrical switch. The current tester provides a current measuring function and is able to display the measured value directly. The first sensing signal and the second sensing signal may be used to measure different ranges of currents. By switching the switching element 21, the current tester can be used to measure different scales of currents and provide different degrees of accuracy. A user does not have to replace the current tester with another one when the scale of the tested current changes, thus improving the convenience and the applicability of the current tester.

Figure 10:
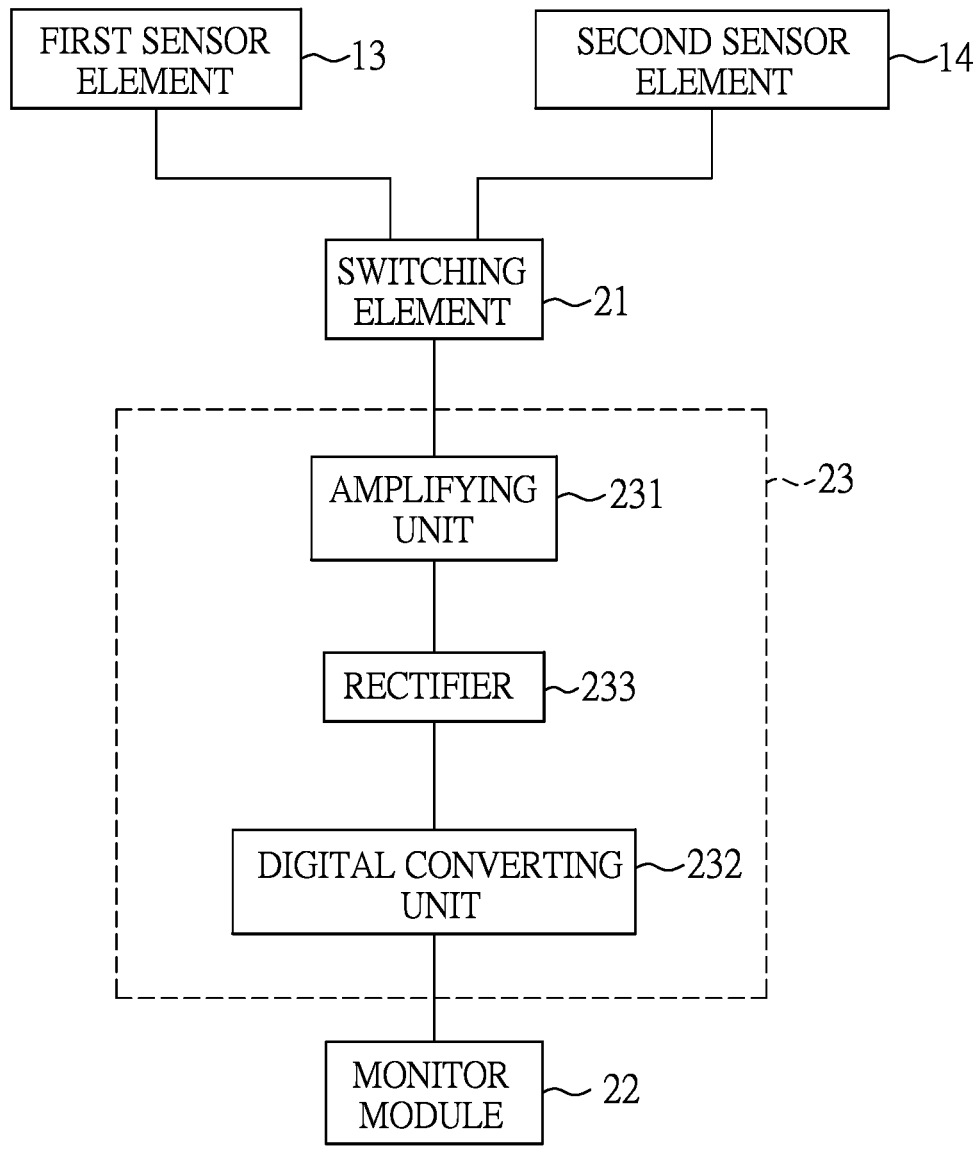
FIG. 10 is another block diagram of a current tester of the present invention.

With reference to FIG. 10, in a sixth embodiment of the present invention, the signal processing module 23 includes an amplifying unit 231 and a digital converting unit 232. The amplifying unit 231 is electrically connected to the output end of the switching element 21 to receive the original sensing signal, which is either the first sensing signal or the second sensing signal, and the digital converting unit 232 is electrically connected to the amplifying unit 231. The amplifying unit 231 amplifies the original sensing signal with a certain gain according to the switching status of the switching and outputs the amplified signal to the digital converting unit 232. The digital converting unit 232 then converts the amplified original sensing signal to a digital sensing signal and outputs the digital sensing signal to the monitor module 22. The monitor module 22 then displays a measured value accordingly.

In a seventh embodiment of the present invention, the signal processing module 23 further includes a rectifier 233 electrically connected between the amplifying unit 231 and the digital converting unit 232. When the tested current is an alternative current (AC), the first sensing signal or the second sensing signal generated is also an AC signal. The rectifier 233 receives the amplified original sensing signal and rectifies it into a DC sensing signal, and outputs it to the digital converting signal. The digital converting signal then converts the DC sensing signal into the digital sensing signal.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A current detecting module, comprising:
    a circular shell;
    a ferrite core mounted inside the circular shell;
    a first sensor element mounted inside the circular shell and sensing a magnetic field in the ferrite core, thereby generating a first sensing signal;
    a second sensor element mounted inside the circular shell and sensing the magnetic field in the ferrite core, thereby generating a second sensing signal; wherein properties of the first sensor element and the second sensor element are different.

2. The current detecting module as claimed in claim 1, wherein the circular shell comprises:
    a first half shell, having a first pivot end, a first connecting end, and a first accommodating space;
    a second half shell, having a second pivot end, a second connecting end, and a second accommodating space, wherein the second pivot end is pivotally connected to the first pivot end; wherein
    the ferrite core includes a first semicircular core and a second semicircular core, wherein the first semicircular core is mounted in the first accommodating space of the first half shell, and the second semicircular core is mounted in the second accommodating space of the second half shell.

3. The current detecting module as claimed in claim 2, wherein
    the first sensor element and the second sensor element are mounted inside the first half shell and close to the first connecting end.

4. The current detecting module as claimed in claim 3, further comprising:
    a signal transmitting and processing unit, having an input end and an output end, the input end electrically connected to the first sensor element and the second sensor element; and
    two signal output ports, electrically connected to the output end of the signal transmitting and processing unit, thereby electrically connected to the first sensor element and the second sensor element; wherein the two signal output ports output the first sensing signal and the second sensing signal.

5. The current detecting module as claimed in claim 2, wherein
    the first sensor element and the second sensor element are mounted inside the first half shell and close to the first pivot end.

6. The current detecting module as claimed in claim 5, further comprising:
    a signal transmitting and processing unit, having an input end and an output end, the input end electrically connected to the first sensor element and the second sensor element; and
    two signal output ports, electrically connected to the output end of the signal transmitting and processing unit, thereby electrically connected to the first sensor element and the second sensor element; wherein the two signal output ports output the first sensing signal and the second sensing signal.

7. The current detecting module as claimed in claim 2, further comprising:
    a signal transmitting and processing unit, having an input end and an output end, the input end electrically connected to the first sensor element and the second sensor element; and
    two signal output ports, electrically connected to the output end of the signal transmitting and processing unit, thereby electrically connected to the first sensor element and the second sensor element; wherein the two signal output ports output the first sensing signal and the second sensing signal.

8. The current detecting module as claimed in claim 1, further comprising:

a signal transmitting and processing unit, having an input end and an output end, the input end electrically connected to the first sensor element and the second sensor element; and two signal output ports, electrically connected to the output end of the signal transmitting and processing unit, thereby electrically connected to the first sensor element and the second sensor element; wherein the two signal output ports output the first sensing signal and the second sensing signal.

9. The current detecting module as claimed in claim 1, wherein
the first sensor element is a first winding having two first tail ends;
the second sensor element is a second winding having two second tail ends; and
the first winding and the second winding are wound around the ferrite core.

10. The current detecting module as claimed in claim 9, further comprising:
an iron circular shell, mounted inside the circular shell and covering the ferrite core, the first sensor element, and the second sensor element.

11. The current detecting module as claimed in claim 9, further comprising:
an insulation layer; wherein
the first sensor element is wound around the ferrite core;
the second sensor element is wound around the first sensor element; and
the insulation layer is disposed between the first sensor element and the second sensor element.

12. A current tester, comprising:
a device body, having an accommodation space, a testing end, and an operating interface, wherein the device body comprises:
 a switching element, mounted on the operating interface and having two input ends and an output end;
 a monitor module, mounted on the operating interface;
 a signal processing module, mounted in the accommodation space of the device body;
a current detecting module, mounted on the testing end of the device body and comprising:
 a circular shell, comprising:
  a first half shell, having a first pivot end, a first connecting end, and a first accommodating space;
  a second half shell, having a second pivot end, a second connecting end, and a second accommodating space, wherein the second pivot end is pivotally connected to the first pivot end;
 a ferrite core, mounted inside the circular shell, including a first semicircular core and a second semicircular core, wherein the first semicircular core is mounted in the first accommodating space of the first half shell, and the second semicircular core is mounted in the second accommodating space of the second half shell;
 a first sensor element, mounted inside the circular shell and sensing a magnetic field in the ferrite core, thereby generating a first sensing signal;
 a second sensor element, mounted inside the circular shell and sensing the magnetic field in the ferrite core, thereby generating a second sensing signal; wherein properties of the first sensor element and the second sensor element are different;
 a signal transmitting and processing unit, mounted inside the circular shell, having an input end and an output end, wherein the input end is electrically connected to the first sensor element and the second sensor element, and the output end extends into the accommodation space of the device body; wherein
the two input ends of the switching element are connected to the output end of the signal transmitting and processing unit to receive the first sensing signal and the second sensing signal, and the switching element conducts one of the two input ends of the switching element and the output end of the switching element and outputs an original sensing signal;
the signal processing module is electrically connected to the output end of the switching element; the signal processing module receives the original sensing signal, detects a switching state of the switching element, and controls the monitor module to display a testing value accordingly.

13. The current tester as claimed in claim 12, wherein the signal transmitting and processing unit is a flexible printed circuit mounted in the first half shell;
wherein the first half shell has an opening that connects the accommodation space of the device body and the first accommodation space of the first half shell;
the output end of the signal transmitting and processing unit extends to the accommodation space of the device body via the opening.

14. The current tester as claimed in claim 13, wherein the signal processing module comprises
an amplifying unit, electrically connected to the output end of the switching element, receiving the original sensing signal, amplifying the original sensing signal according to the switching state of the switching element, and outputting the amplified original sensing signal;
a digital converting unit, electrically connected to the amplifying unit, receiving the amplified original sensing signal, converting the amplified original sensing signal into a digital sensing signal, and outputting the digital sensing signal to the monitor module.

15. The current tester as claimed in claim 14, wherein the signal processing module further comprises:
a rectifier, electrically connected between the amplifying unit and the digital converting unit, rectifying the amplified original sensing signal, and outputting an rectified sensing signal to the digital converting unit.

16. A current tester, comprising:
a device body, having an accommodation space, a testing end, and an operating interface, wherein the device body comprises:
 a switching element, mounted on the operating interface and having two input ends and an output end;
 a monitor module, mounted on the operating interface;
a signal processing module, mounted in the accommodation space of the device body;
a current detecting module, mounted on the testing end of the device body, and comprising:
 a circular shell;
 a ferrite core, mounted inside the circular shell;
 a first sensor element, mounted inside the circular shell and sensing a magnetic field in the ferrite core, thereby generating a first sensing signal;
 a second sensor element, mounted inside the circular shell and sensing the magnetic field in the ferrite core, thereby generating a second sensing signal; wherein properties of the first sensor element and the second sensor element are different wherein
the first sensor element is a first winding having two first tail ends, and the second sensor element is a second winding having two second tail ends; wherein the first winding and the second winding are wound around the ferrite core, with the first tail ends and the second tail ends extending into the accommodation space of the device body; wherein the two input ends of the switching element are connected to the first tail ends and the second tail ends to receive the first sensing signal and the second sensing signal, and the switching element conducts one of the two input ends of the switching element and the output end of the switching element and outputs an original sensing signal;

the signal processing module is electrically connected to the output end of the switching element; the signal processing module receives the original sensing signal, detects a switching state of the switching element, and controls the monitor module to display a testing value accordingly.

17. The current tester as claimed in claim 16, wherein the signal processing module comprises:

an amplifying unit, electrically connected to the output end of the switching element, receiving the original sensing signal, amplifying the original sensing signal according to the switching state of the switching element, and outputting an amplified original sensing signal;

a rectifier, electrically connected to the amplifying unit to receive the amplified original sensing signal, rectifying the amplified original sensing signal, and outputting a rectified sensing signal;

a digital converting unit, electrically connected to the rectifier, receiving the rectified sensing signal, converting the rectified sensing signal into a digital sensing signal, and outputting the digital sensing signal to the monitor module.

* * * * *